(12) United States Patent
Nakashima

(10) Patent No.: US 6,903,322 B2
(45) Date of Patent: Jun. 7, 2005

(54) SOLID-STATE IMAGING DEVICE AND METHOD FOR PRODUCING THE SAME

(75) Inventor: Yoshimitsu Nakashima, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/824,549

(22) Filed: Apr. 2, 2001

(65) Prior Publication Data

US 2001/0054677 A1 Dec. 27, 2001

(30) Foreign Application Priority Data

Apr. 3, 2000 (JP) .......................................... 2000-100230

(51) Int. Cl.[7] .......................... H01L 27/00; H01L 31/00; H01L 27/148; H01L 29/768
(52) U.S. Cl. ................................ 250/208.1; 250/214.1; 257/233
(58) Field of Search ........................... 250/208.1, 239, 250/216, 214.1; 257/422, 232, 233

(56) References Cited

U.S. PATENT DOCUMENTS

| | | | |
|---|---|---|---|
| 4,986,878 A | * | 1/1991 | Malazgirt et al. ........... 427/271 |
| 5,908,672 A | * | 6/1999 | Ryu et al. ............... 427/255.29 |
| 6,274,917 B1 | * | 8/2001 | Fan et al. .................... 257/432 |
| 6,396,089 B1 | * | 5/2002 | Lin et al. ..................... 257/225 |
| 2001/0042875 A1 | * | 11/2001 | Yoshida ....................... 257/233 |
| 2001/0043175 A1 | * | 11/2001 | Yasukawa ..................... 345/87 |

FOREIGN PATENT DOCUMENTS

| | | | | |
|---|---|---|---|---|
| GB | 2307344 A | * | 5/1997 | ....... H01L/21/3105 |
| GB | 0887847 A1 | * | 12/1998 | ....... H01L/21/3105 |
| JP | 63-318154 | | 12/1988 | |

* cited by examiner

*Primary Examiner*—Georgia Epps
*Assistant Examiner*—Alicia Harrington
(74) *Attorney, Agent, or Firm*—Edwards & Angell, LLP; David G. Conlin; George W. Hartnell, III

(57) ABSTRACT

A solid-state imaging device includes a semiconductor substrate, a light shielding section having an aperture for partially shielding light incident on a surface of the semiconductor substrate, a light reception section for converting the light which is incident on the surface of the semiconductor substrate through the aperture to an electric charge, and a passivation section having a substantially flat top surface and overlying the light shielding section, the light reception section and the aperture.

20 Claims, 6 Drawing Sheets

_US 6,903,322 B2_

SOLID-STATE IMAGING DEVICE AND METHOD FOR PRODUCING THE SAME

BACKGROUND OF THE INVENTION

1. Field of the Invention

The present invention relates to a solid-state imaging device, and in particular to a solid-state imaging device structured so as to enhance the sensitivity of a light reception section thereof and a method for producing such a device.

2. Description of the Related Art

In recent years, the transmission and reception of images is becoming indispensable to portable information devices and the like including cellular phones. So-called solid-state imaging devices such as CCDs are used for imaging purposes while liquid crystal panels are used for displaying images. In the field of solid-state imaging devices, CMOS image sensors based on a so-called CMOS logic process, which is typically used for producing a normal integrated circuit, are widely developed with a view to achieving low power consumption and a low cost. As in the case of CCDs, the demand for higher resolution and miniaturization has necessitated CMOS image sensors having reduced pixel size, as well as having a reduced area of the light reception section, and a reduced aperture size in a light shielding film. However, since CMOS image sensors have so far been developed based on the so-called logic process, very little attention has been paid to the optical characteristics of CMOS image sensors, such as reflection or refraction at interfaces between the layers of multi-layered films incorporated therein. Therefore, it is difficult with CMOS image sensors to efficiently converge incident light and obtain sufficient sensitivity.

A conventional solid-state imaging device, in particular a CMOS image sensor, will be described with reference to FIG. 5. A light reception section 12 is formed on a top surface of a silicon substrate 11 for converting incident light (hν) to an electric charge. An interlaminar insulation film 13 is formed on the silicon substrate 11 for electrically isolating a first metal layer 18, a second metal layer 19, and a light shielding film 14 from one another. The light shielding film 14 is formed so as not to overlie a light reception face of the light reception section 12, so that light incident on the interlaminar insulation film 13 does not fall anywhere except the light reception section 12. A passivation film 15 is formed on the light shielding film 14 and on the interlaminar insulation film 13 which is present within an aperture of the light shielding film 14. The passivation film 15 provides moisture-resistance, chemical resistance, and improved barrier properties against impurities such as Na ions, oxygen, etc., and metals. A planarization film 16 is formed on the passivation film 15. A microlens 17 is formed for converging light which is incident on the planarization film 16. As the interlaminar insulation film 13, a deposited film such as a P (plasma CVD)-$SiO_2$ film, an NSG film (a silicon oxide film containing no impurities), a BPSG film (a silicon oxide film containing phosphorus and boron) or the like is used. As the passivation film 15, a monolayer film, such as a P (plasma CVD)-SiN film, or a deposited film composed of a P-SiN film and a PSG film (a silicon oxide film containing phosphorus), is generally used. The planarization film 16 is generally composed of an acrylic material. In the case of a color solid-state imaging device, an acrylic material and a color filter are utilized as the planarization film 16. In conventional CMOS image sensor structures, the passivation film 15 has a stepped portion as described above, which prevents the convergence of light. When such a structure is adapted for higher resolution and miniaturization, the stepped portion of the passivation film 15 causes a decrease in the amount of light converged on the light reception section 12, thereby making it difficult to obtain sufficient sensitivity.

A method for producing the above-described device will now be described with reference to FIG. 6. The light reception section 12 is formed in the silicon substrate 11 through ion implantation, heat treatment, etc. After forming a polycrystalline silicon film and a silicide film on the silicon substrate 11 by using a CVD technique, a gate electrode (not shown) is formed by patterning, etching, or the like. Thereafter, a BPSG film is deposited as the interlaminar insulation film 13 by a CVD technique. When the BPSG film receives heat treatment at a high temperature, the film becomes fluid so that its surface can be flattened. By taking advantage of such characteristics of the BPSG film, the surface of the BPSG film is flattened so as to facilitate the formation of the first metal layer 18. The first metal layer 18 is formed by depositing TiN, Al or the like on the BPSG film by using a sputtering or CVD technique. Upon the first metal layer 18, the P-$SiO_2$ film is deposited as the interlaminar insulation film 13 by using a CVD technique and the surface thereof is flattened by chemical machine polishing. Thereafter, as in the case of the first metal layer 18, a thin film of TiN, Al, or the like is formed as the second metal layer 19 by using a sputtering or CVD technique. Similarly, upon the second metal layer 19, a P-$SiO_2$ film is deposited as the interlaminar insulation film 13 by using a CVD technique and the surface thereof is flattened by the chemical machine polishing. Thereafter, TiN, Al, or the like is deposited as the light shielding film 14 by using a sputtering or CVD technique, and the resultant film is patterned and etched so as not to overlie the light reception section 12. Upon the light shielding film 14, a P-SiN film is deposited as the passivation film 15 by using a CVD technique or the like. The planarization film 16 is formed by applying an acrylic material to the passivation film 15. In the case of a color solid-state imaging device, an acrylic material is applied; a color filter is formed; and then the acrylic material is further applied thereto as a protection coating, thereby completing the planarization film 16. Thereafter, a lens material is applied and the microlens 17 is formed by patterning and heat treatment.

In a conventional solid-state imaging device shown as FIG. 5A, the refractive index of the P-SiN film used for the passivation film 15 is about 2.0 while the refractive index of the acrylic material used for the planarization film 16 is about 1.5 to 1.6. In the case where the refractive index of the passivation film 15 is higher than that of the planarization film 16, when light falls onto an edge of the passivation film 15, the incident light is not converged on the light reception section 12 but rather refracted so as to travel outside the light reception section 12 toward the first metal layer 18 or the second metal layer 19 since the edge of the passivation film 15 has a rounded shape. As shown in an enlarged view of FIG. 5B, when light falls onto the flat top surface of the stepped portion, total internal reflection can occur at an interface between the planarization film 16 and a face of the passivation film 15 parallel to a side face of the light shielding film 14, depending on the incident angle of the light, since the refractive index of the passivation film 15 is higher than that of the planarization film 16. The incident light passes along the face of the passivation film 15 parallel to the side face of the light shielding film 14 so that the light is not converged on the light reception section 12. As described above, in the conventional structure shown as FIG. 5A, any light incident on a portion of the passivation film 15 neighboring the side face of the light shielding film 14 is not converged on the light reception section 12. Therefore, the effective aperture size of the light shielding film 14 is smaller than the actual aperture size by an amount corresponding to the thickness of the passivation film 15.

The light reception face of the light reception section 12 used to be sufficiently large relative to the stepped portion of the passivation film 15. However, due to the reduced pixel size which is necessitated for improved resolution and miniaturization, the light reception face of the light reception section 12 is becoming smaller and the aperture of the light shielding film 14 is also becoming narrower. Therefore, the ratio of the amount of light incident on the stepped portion of the passivation film 15 to the amount of light incident on the aperture of the light shielding film 14 increases, thereby making it difficult to obtain sufficient sensitivity. However, the passivation film 15 can not be omitted because the passivation film 15 plays an important role in providing moisture-resistance, chemical resistance and/or improved barrier properties against impurities such as Na ions, oxygen, etc., and metals.

The effect of the stepped portion of the passivation film 15 on the numerical aperture of the light shielding film 14 will now be described in detail. Provided that the sensitivity deteriorates by an amount corresponding to the thickness of the passivation film 15, the aperture size can be represented as (pixel size)−(width of the light shielding film)−(2× thickness of the passivation film 15). For example, in the case where the width of the light shielding film 14 is 1.5 $\mu$m, and the thickness of the passivation film 15 is 0.5 $\mu$m, given a pixel size of 10 $\mu$m×10 $\mu$m, the aperture of the light shielding film 14 is calculated to be 10−1.5−(0.5×2)=7.5 $\mu$m, and therefore, the numerical aperture is 75%. Similarly, given a pixel size of 5 $\mu$m×5 $\mu$m, the aperture of the light shielding film 14 is calculated to be 5−1.5−(0.5×2)=2.5 $\mu$m, and therefore, the numerical aperture is 50%. Starting from the above one-dimensional calculation, it will be seen that the numerical aperture area as calculated in a two-dimensional manner gives rise to an even greater difference in the size (area) between the aperture and each pixel. The reduction in the numerical aperture of the light shielding film 14 is highly detrimental to the ratio of light incident on the light reception face of the light reception section 12; this effect is more detrimental than any reduction in the numerical aperture of layers below the light shielding film 14.

SUMMARY OF THE INVENTION

According to one aspect of this invention, there is provided a solid-state imaging device, including a semiconductor substrate, a light shielding section having an aperture for partially shielding light incident on a surface of the semiconductor substrate, a light reception section for converting the light which is incident on the surface of the semiconductor substrate through the aperture to an electric charge, and a passivation section having a substantially flat top surface and overlying the light shielding section, the light reception section and the aperture.

According to one embodiment of the invention, the passivation section includes at least a silicon nitride-based monolayer film.

According to another embodiment of the invention, a solid-state imaging device further includes an insulation section having a substantially flat top surface which is interposed between the passivation section and the light shielding section.

According to still another embodiment of the invention, the insulation section includes at least a silicon oxide-based monolayer film.

According to another aspect of the invention, there is provided a method for producing a solid-state imaging device which includes a semiconductor substrate, a light shielding section having an aperture for partially shielding light incident on a surface of the semiconductor substrate, a light reception section for converting the light which is incident on the surface of the semiconductor substrate through the aperture to an electric charge, and a passivation section having a substantially flat top surface and overlying the light shielding section, the light reception section and the aperture, and the method includes the steps of forming a thin film used for forming the passivation section on the light shielding section and the aperture, and flattening a surface of the thin film to form the passivation section by chemical machine polishing.

According to still another aspect of the invention, there is provided a method for producing a solid-state imaging device which includes a semiconductor substrate, a light shielding section having an aperture for partially shielding light incident on a surface of the semiconductor substrate, a light reception section for converting the light which is incident on the surface of the semiconductor substrate through the aperture to an electric charge, and a passivation section having a substantially flat top surface and overlying the light shielding section, the light reception section and the aperture, and the method includes the steps of forming a thin film used for forming the passivation section on the light shielding section, applying an SOG film to the thin film used for forming the passivation section, and performing an etchback technique under a condition that a selective ratio of the SOG film to the thin film used for forming the passivation section is about 1 to 1.

According to still another aspect of the invention, there is provided a method for producing a solid-state imaging device which includes a semiconductor substrate, a light shielding section having an aperture for shielding light incident on a surface of the semiconductor substrate, a light reception section for converting the light which is incident on the surface of the semiconductor substrate through the aperture to an electric charge, a passivation section having a substantially flat top surface and overlying the light shielding section, the light reception section and the aperture, and an insulation section having a substantially flat top surface which is interposed between the passivation section and the light shielding section, and the method includes the steps of forming the insulation section on the light shielding section, flattening a surface of the insulation section by chemical machine polishing, and forming the passivation section so as to have the substantially flat top surface by depositing a material used for forming the passivation section on the insulation section.

According to still another aspect of the invention, there is provided a method for producing a solid-state imaging device which includes a semiconductor substrate, a light shielding section having an aperture for partially shielding light incident on an surface of the semiconductor substrate, a light reception section for converting the light which is incident on the surface of the semiconductor substrate through the aperture to an electric charge, a passivation section having a substantially flat top surface and overlying the light shielding section, a light reception section and the aperture, and an insulation section having a substantially flat top surface which is interposed between the passivation section and the light shielding section, and the method includes the steps of forming the insulation section so as to have the substantially flat top surface by applying an SOG film to the light shielding section and the aperture, and forming the passivation section so as to have the substantially flat top surface by depositing a material used for forming the passivation section on the insulation section.

In order to achieve the above-described objectives, according to the present invention, a passivation film is deposited on an interlaminar insulation film so as to have a thickness which is greater than that of a light shielding film. Thereafter, a portion of the thickly deposited passivation film is removed, to such an extent that the light shielding film is not exposed, by chemical machine polishing or by using an etchback technique after applying an SOG to the passivation film. Thus, a surface of the passivation film is flattened.

Alternatively, a silicon oxide-based insulation film is thickly deposited on the light shielding film and the interlaminar insulation film in the manner described above. Thereafter, a portion of the resultant film is removed, to such an extent that the light shielding film is not exposed, by using chemical machine polishing. Thus, a surface of the film is flattened. A passivation film is then deposited on a top surface of the silicon oxide-based insulation film. Since the top surface of the silicon oxide-based insulation film is flat, the top surface of the passivation film, which is deposited on the insulation film, also becomes flat. Therefore, the passivation film is prevented from having any stepped portion, which is one problem associated with a conventional passivation film.

Alternatively, an SOG film is applied on the light shielding film and the interlaminar insulation film. The passivation film is then deposited on a top surface of the SOG film. Since the top surface of the SOG film is flat, the top surface of the passivation film, which is deposited on the SOG film, also becomes flat. Therefore, the passivation film is prevented from having any stepped portion, which is one problem associated with a conventional passivation film.

As described above, through the use of the aforementioned techniques, according to the present invention, the passivation film is prevented from having any stepped portion, which is one problem associated with a conventional passivation film. Therefore, a component of light which would otherwise fall onto stepped areas to be refracted in directions away from the light reception section can be converged on the light reception section. Thus, the imaging device according to the present invention can be adapted for higher resolution and miniaturization.

Thus, the invention described herein makes possible the advantages of: (1) providing a solid-state imaging device which can converge incident light on a light reception section thereof due to the absence of stepped portions on a passivation film; and (2) providing a method for producing such a solid-state imaging device.

These and other advantages of the present invention will become apparent to those skilled in the art upon reading and understanding the following detailed description with reference to the accompanying figures.

DESCRIPTION OF THE PREFERRED EMBODIMENTS

Examples of the present invention will be described below in detail with reference to drawings.

EXAMPLE 1

Figure 1:
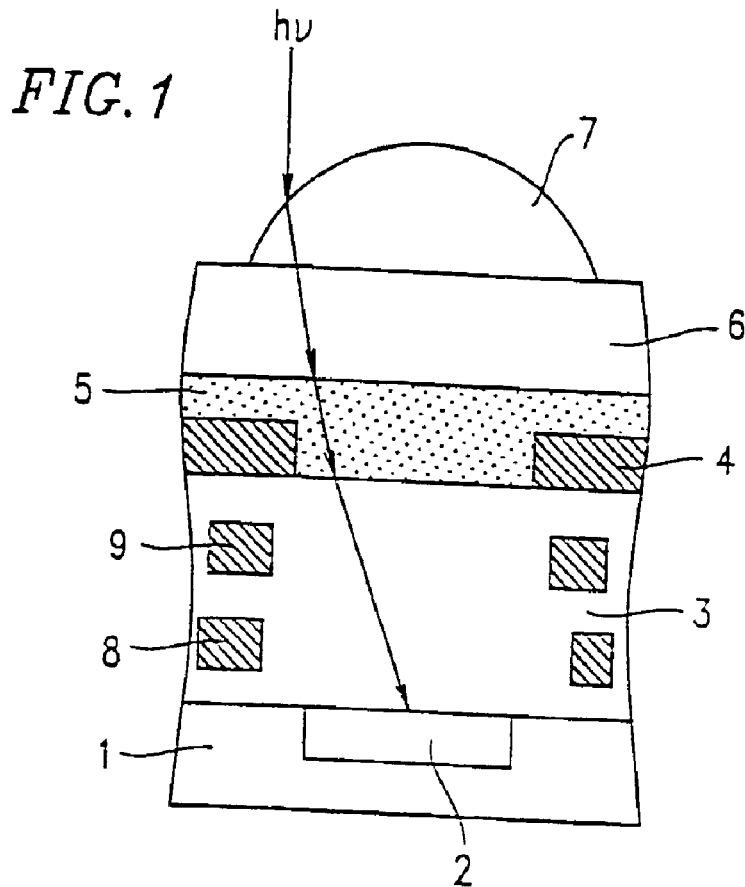
FIG. 1 is a cross-sectional view of a solid-state imaging device according to Example 1 of the present invention.

A basic structure of Example 1 of the present invention is shown in FIG. 1. As shown in FIG. 1, a light reception section 2 for converting incident light to an electric charge is formed on a top surface of a silicon substrate 1. An interlaminar insulation film 3 for electrically isolating a first metal layer 8, a second metal layer 9, and a light shielding film 4 from one another is formed on the silicon substrate 1. The light shielding film 4 is formed on the interlaminar insulation film 3 without overlying, a light reception face of the light reception section 2, so that incident light does not fall anywhere except the light reception section 2. A passivation film 5 is formed on the light shielding film 4 and on the interlaminar insulation film 3 which is present within an aperture of the light shielding film 4 in order to provide moisture-resistance, chemical resistance, and improved barrier properties against impurities such as Na ions, oxygen, etc., and metals. A portion of the passivation film 5 is removed, to such an extent that the light shielding film 4 is not exposed, by using chemical machine polishing or an etchback technique. Thus a surface of the passivation film is flattened. A planarization film 6 is formed on the passivation film 5. A microlens 7 is formed for converging light which is incident on the planarization film 6. In Example 1, the passivation film 5 may be in the form of a SiN-based monolayer film, or a deposited film composed of a SiN-based film, having a refractive index of about 2.0. An acrylic material is used for the planarization film 6, having a refractive index of about 1.5 to 1.6.

Figures 5A, 5B:
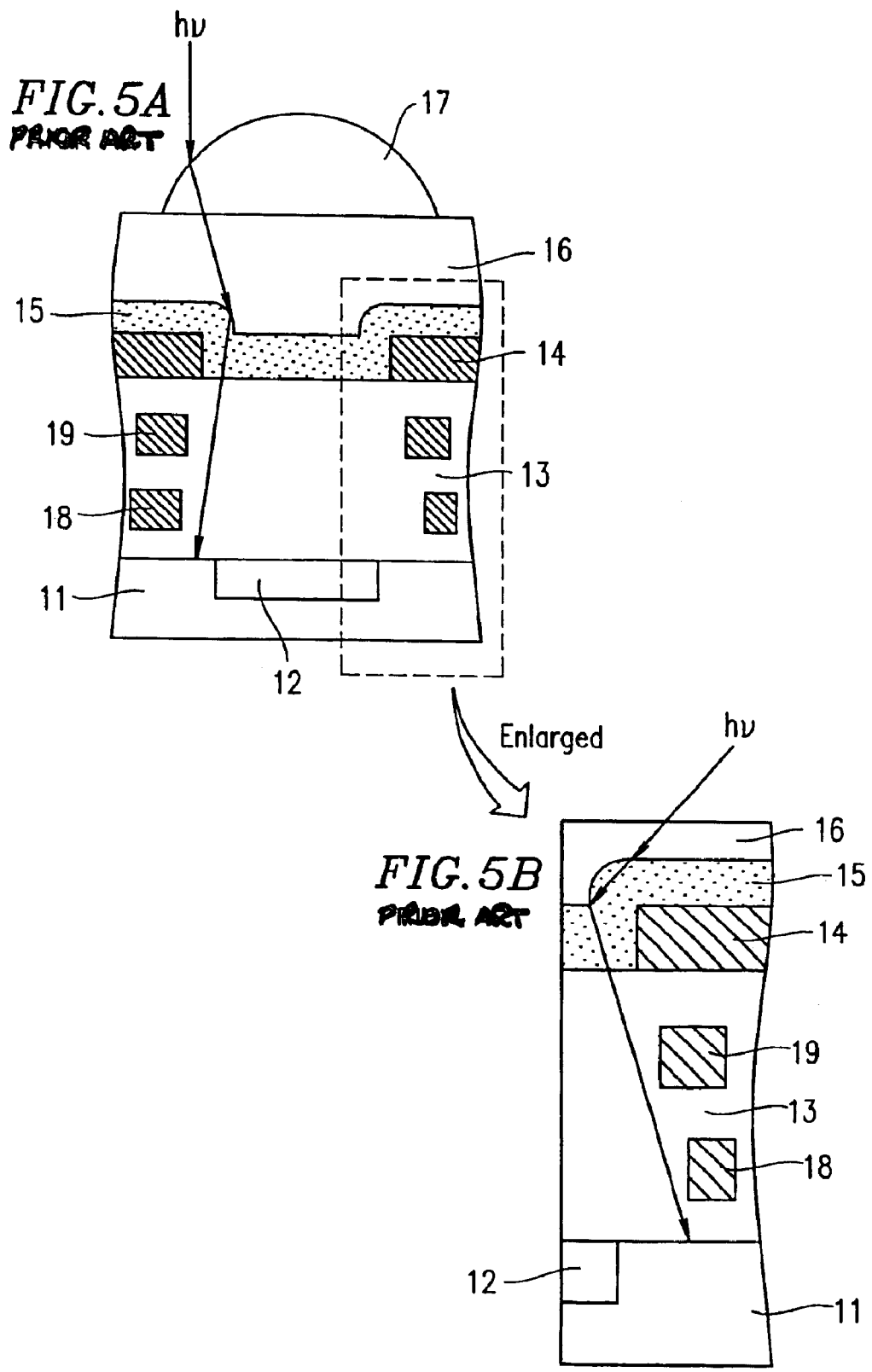
FIG. 5A is a cross-sectional view illustrating a structure of a conventional solid-state imaging device.
FIG. 5B is a partial enlarged view of FIG. 5A.
Figure 6A:
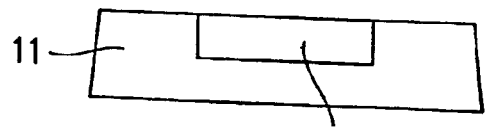
FIGS. 6A, 6B, 6C, 6D, 6E, and 6F are cross-sectional views illustrating production steps of a conventional solid-state imaging device.
Figure 6B:
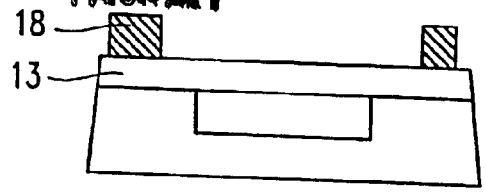
Figure 6C:
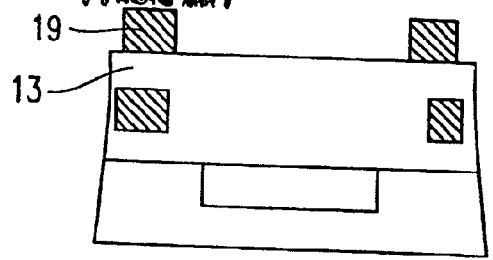
Figure 6D:
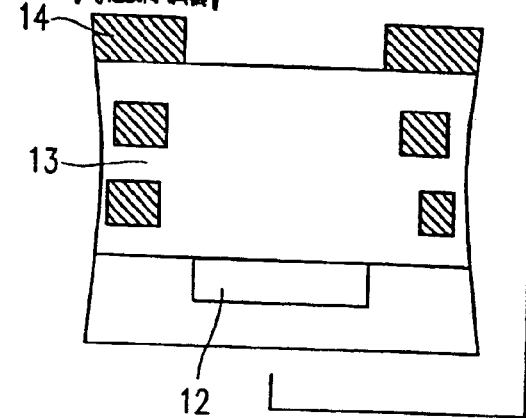
Figure 6E:
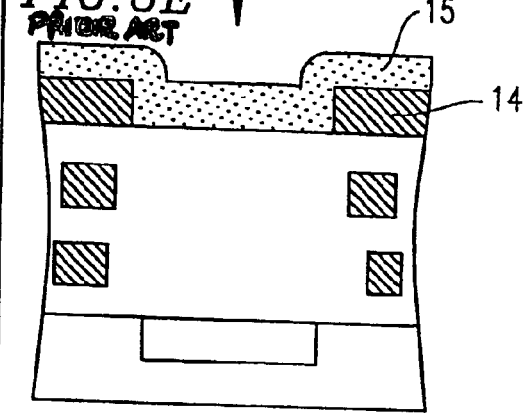
Figure 6F:
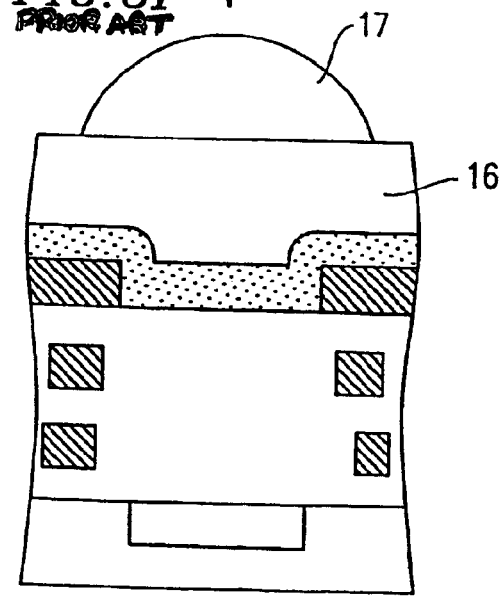

In conventional structures, the passivation film 15 would have a stepped portion as shown in FIGS. 5A and 5B. Light incident on the stepped portion is refracted in directions away from the light reception section, due to the different refractive index of an edge of the stepped portion. Since the refractive index of the passivation film 15 is higher than that of the planarization film 16, total internal reflection occurs at an interface between the planarization film 16 and a face of the passivation film 15 parallel to a side face of the light shielding film 14, so that incident light is not converged on the light reception section 12. However, in the structure according to Example 1 of the present invention, the passivation film 5 is thickly deposited and a top surface thereof is flattened by chemical machine polishing or an etchback technique, so that any refraction of incident light associated with a stepped portion, as in the case of the passivation film 15 of conventional structures, does not occur. As a result, most of light converged by the microlens 7 is converged on the light reception section 2.

Figure 3A:
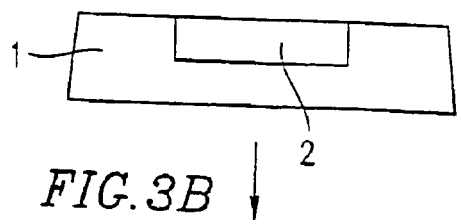
FIGS. 3A, 3B, 3C, 3D, 3E, and 3F are cross-sectional views illustrating production steps of a solid-state imaging device according to Example 1 of the present invention.
Figure 3B:
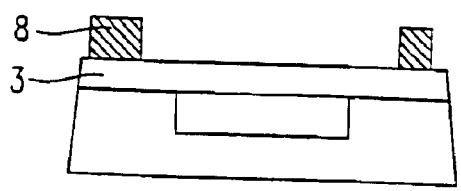
Figure 3C:
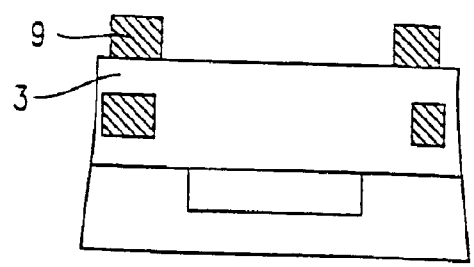
Figure 3D:
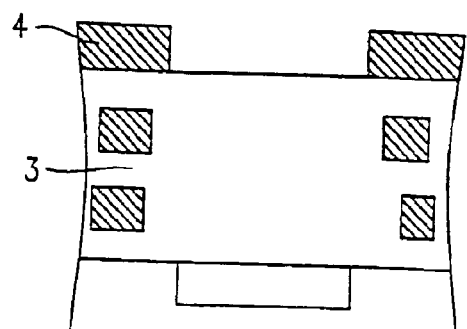
Figure 3E:
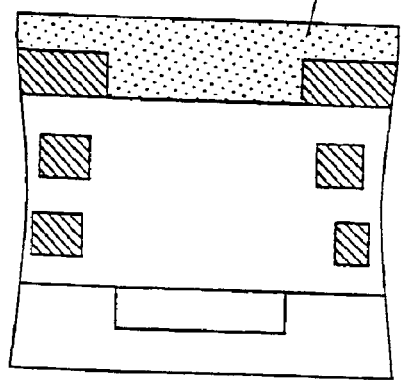

A method for producing a solid-state imaging device according to Example 1 of the present invention will now be described with reference to FIGS. 3A, 3B, 3C, 3D, 3E, and 3F. The light reception section 2 is formed in the silicon substrate 1 through ion implantation, heat treatment, etc. (FIG. 3A). After forming a polycrystalline silicon film and a silicide film on the silicon substrate 1 by using a CVD technique, a gate electrode (not shown) is formed by patterning, etching, or the like. Thereafter, a BPSG film is deposited so as to have a thickness of about 5000 Å to 15000 Å as the interlaminar insulation film 3 by a CVD technique. By subjecting the BPSG film to heat treatment at about 850 to 950° C., its surface is flattened so as to facilitate the formation of the first metal layer 8. The first metal layer 8 is formed by depositing TiN to a thickness of about 300 Å to 1000 Å and Al to a thickness of about 3000 Å to 10000 Å on the BPSG film by using a sputtering or CVD technique (FIG. 3B). Upon the first metal layer 8, a P-SiO$_2$ film having a thickness of about 20000 Å to 25000 Å is deposited as the interlaminar insulation film 3 by using a CVD technique, and a thickness of about 10000 Å is removed from the resultant film by chemical machine polishing, thereby flattening the film surface. Thereafter, as in the case of the first metal layer 8, TiN having a thickness of about 300 Å to 1000 Å and Al having a thickness of about 3000 Å to 10000 Å are deposited as the second metal layer 9 by using a sputtering or CVD technique (FIG. 3C). Similarly, upon the second metal layer 9, a P-SiO$_2$ film having a thickness of about 20000 Å to 25000 Å is deposited as the interlaminar insulation film 3 by using a CVD technique and a thickness of about 10000 Å is removed from the resultant film by chemical machine polishing, thereby flattening the film surface. Thereafter, TiN having a thickness of about 300 Å to 1000 Å and Al having a thickness of about 3000 Å to 10000 Å are deposited as the light shielding film 4 by using a sputtering or CVD technique, and the resultant film is patterned and etched so as not to overlie the light reception section 2 (FIG. 3D). Upon the light shielding film 4, a P-SiN film having a thickness of 20000 Å is deposited as the passivation film 5. Thereafter, a thickness of about 10000 Å is removed from the P-SiN film by chemical machine polishing, thereby flattening the film surface (FIG. 3E). In another way of flattening, conventional production steps are used so as to form the light shielding film 4, and thereafter, a P-SiN layer is thickly deposited as the passivation film 5 by using a CVD technique or the like.

Figure 3F:
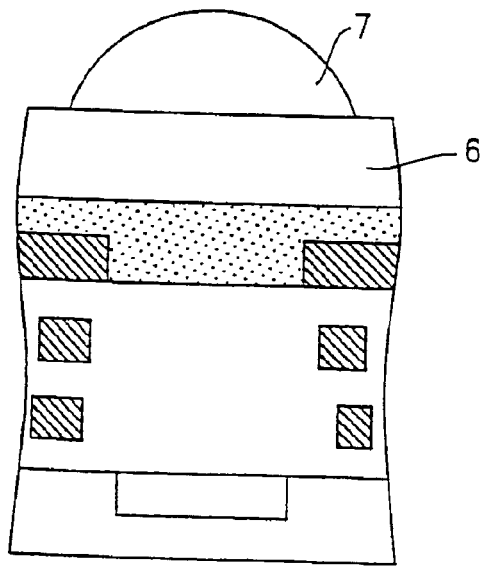

Thereafter, SOG is applied to a top surface of the passivation film 5 and a top surface of the resultant film is etched by using an RIE under an etching condition such that the selectivity ratio of the P-SiN to the SOG is about 1:1, thereby flattening the top surface of the passivation film 5. More particulaly, the light shielding film 4 is deposited so as to have a thickness of about 3000 Å to 10000 Å, and a P-SiN film having a thickness of about 20000 Å is deposited as the passivation film 5. SOG is applied to the P-SiN film so as to have a thickness of about 15000 Å. A 1:1 selectivity ratio of P-SiN to SOG can be obtained under the following RIE etching conditions: pressure: 4 to 15 Pa; CHF$_3$: 20 to 50 sccm; CF$_4$: 20 to 50 sccm; Ar: 50 to 100 sccm: O$_2$: 1 to 5 sccm; and RF: 200 to 700 W. By performing etching under such conditions, the top surface of the P-SiN film can be flattened (FIG. 3E). After flattening the top surface of the passivation film 5, a planarization film 6 is formed by applying an acrylic material to the passivation film 5. In the case of a color solid-state imaging device, an acrylic material is applied; a color filter is formed; and then the acrylic material is further applied thereto as a protection coating, thereby completing the planarization film 6. Thereafter, a lens material is applied to the planarization film 6, and the microlens 7 is formed by patterning and heat treatment (FIG. 3F).

Since the stepped portions of the passivation film 5 are eliminated, the aperture of the light shielding film 4 can be represented as (pixel size)−(width of light shielding film). For example, in the case where the width of the light shielding film 4 is 1.5 μm, given a pixel size of 5 μm×5 μm, the aperture of the light shielding film 4 is calculated to be 5−1.5=3.5 μm, and therefore, the numerical aperture is 70%. Since the conventional numerical aperture is 50%, the numerical aperture of the present example is improved so as to be 1.4 times the conventional numerical aperture.

EXAMPLE 2

Example 2 of the present invention will now be described.

Figure 2:
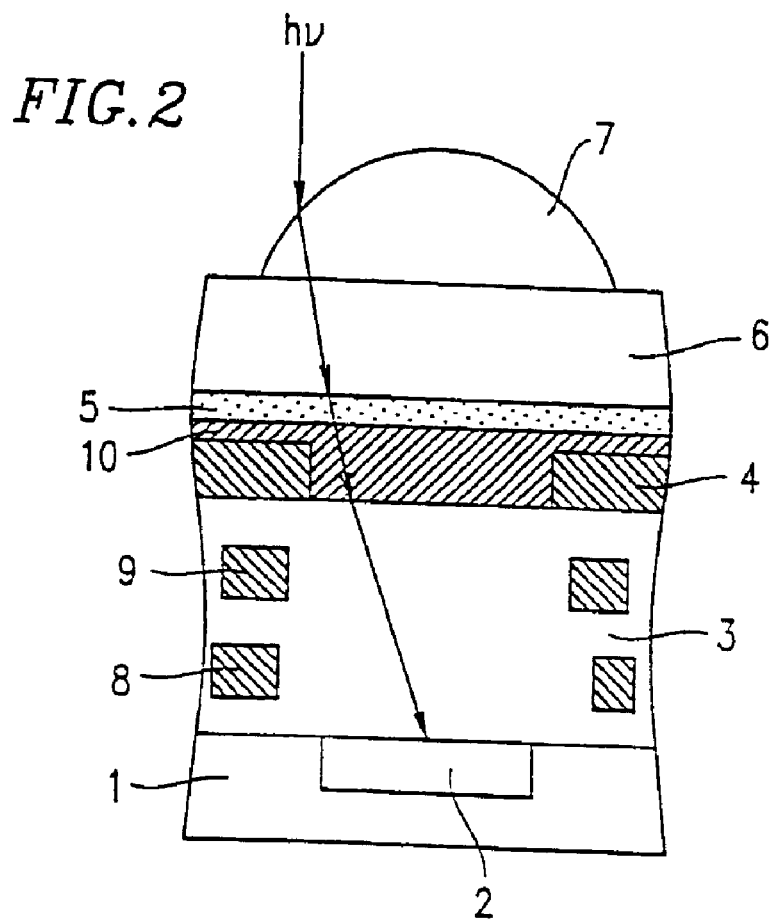
FIG. 2 is a cross-sectional view of a solid-state imaging device according to Example 2 of the present invention.

A basic structure of Example 2 of the present invention is shown in FIG. 2. As shown in FIG. 2, a light reception section 2 for converting incident light to an electric charge is formed on a top surface of a silicon substrate 1. An interlaminar insulation film 3 for electrically isolating a first metal layer 8, a second metal layer 9, and a light shielding film 4 from one another is formed on the silicon substrate 1. The light shielding film 4 is formed on the interlaminar insulation film 3 without overlying a light reception face of the light reception section 2, so that incident light does not fall anywhere except the light reception section 2. A silicon oxide film 10 is formed on the light shielding film 4 and on the interlaminar insulation film 3 which is present within an aperture of the light shielding film 4. A portion of the silicon oxide film 10 is removed, to such an extent that the light shielding film 4 is not exposed, by using chemical machine polishing. Thus a surface of the silicon oxide film 10 is flattened. When the silicon oxide film 10 is formed by application of SOG, a silicon oxide film having a flat top surface can be formed without performing chemical machine polishing. A passivation film 5 is formed on the silicon oxide film 10 in order to provide moisture-resistance, chemical resistance, and improved barrier properties against impurities such as Na ions, oxygen, etc., and metals. A planarization film 6 is formed on the passivation film 5. A microlens 7 is formed for converging light which is incident on the planarization film 6.

In Example 2, because it is more advantageous to flatten the top surface of the silicon oxide-based film than to flatten the top surface of the P-SiN film, it is easier to apply chemical machine polishing to the silicon oxide film 10 than to the P-SiN passivation film 5 for the following reasons. Firstly, a silicon oxide-based film can be relatively easily etched since its etching rate is faster than that of the P-SiN film. Secondly, since chemical machine polishing is performed at the time of forming the interlaminar insulation film 3, a conventional chemical machine polishing technique can be applied to the silicon oxide-based film. Since the passivation film 5 is deposited on the silicon oxide film 10 after the top surface of the silicon oxide film 10 is flattened, a top surface of the passivation film 5 can also be flattened. Thus, the stepped portion of the passivation film 5 shown in FIG. 5A can be eliminated, so that light which is converged by the microlens 7 on the light reception section 2 can be converged without being obstructed.

Figure 4A:
FIGS. 4A, 4B, 4C, 4D, 4E, 4F and 4G are cross-sectional views illustrating production steps of a solid-state imaging device according to Example 2 of the present invention.
Figure 4B:
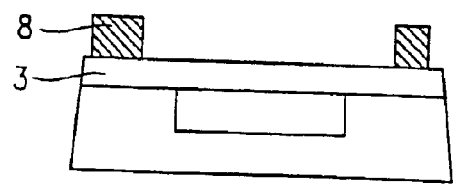
Figure 4C:
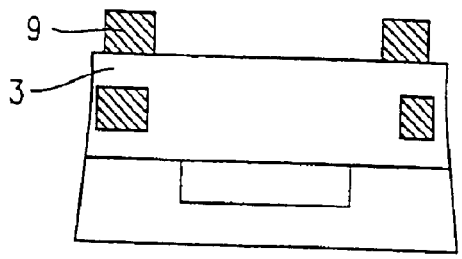
Figure 4D:
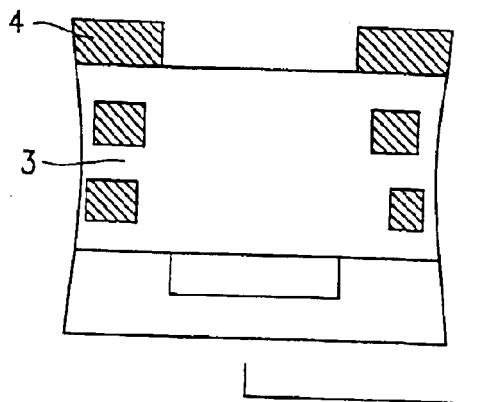
Figure 4E:
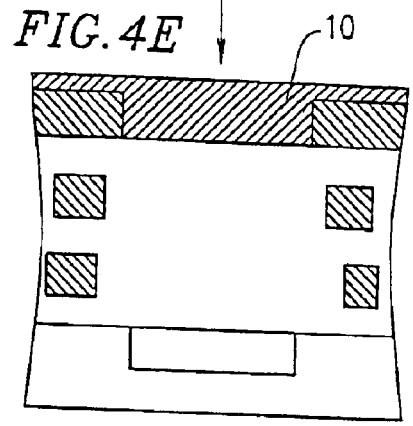
Figure 4F:
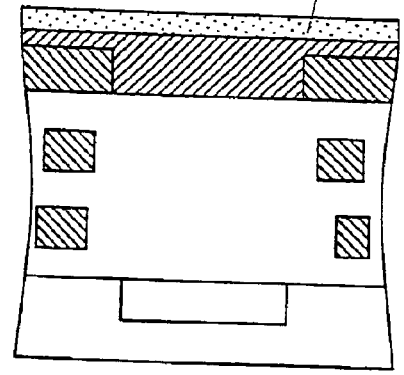

A method for producing a solid-state imaging device according to Example 2 will now be described with reference to FIG. 4. Production steps of the conventional method and Example 1 are used in Example 2 so as to form the light shielding film 4. The light reception section 2 is formed in the silicon substrate 1 through ion implantation, heat treatment, etc. (FIG. 4A). After forming a polycrystalline silicon film and a suicide film on the silicon substrate 1 by using a CVD technique, a gate electrode (not shown) is formed by patterning, etching, or the like. Thereafter, a BPSG film having a thickness of about 5000 Å to 15000 Å is deposited as the interlaminar insulation film 3 by a CVD technique. By subjecting the BPSG film to heat treatment at about 850 to 950° C., its surface is flattened so as to facilitate the formation of the first metal layer 8. The first metal layer 8 is formed by depositing TiN to a thickness of about 300 Å to 1000 Å and Al to a thickness of about 3000 Å to 10000 Å on the BPSG film by using a sputtering or CVD technique (FIG. 4B). Upon the first metal layer 8, a P-SiO$_2$ film having a thickness of about 20000 Å to 25000 Å is deposited as the interlaminar insulation film 3 by using a CVD technique, and a thickness of about 10000 Å is removed from the P-SiN film by chemical machine polishing, thereby flattening the film surface. Thereafter, as in the case of the first metal layer 8, TiN having a thickness of about 300 Å to 1000 Å and Al having a thickness of about 3000 Å to 10000 Å are deposited as the second metal layer 9 by using a sputtering or CVD technique (FIG. 4C). Similarly, upon the second metal layer 9, a P-SiO$_2$ film having a thickness of about 20000 Å to 25000 Å is deposited as the interlaminar insulation film 3 by using a CVD technique, and a thickness of about 10000 Å is removed from the P-SiO$_2$ film by chemical machine polishing, thereby flattening the film surface. Thereafter, TiN having a thickness of about 300 Å to 1000 Å and Al having a thickness of about 3000 Å to 10000 Å are deposited as the light shielding film 4 by using a sputtering or CVD technique, and the resultant film is patterned and etched so as not to overlie the light reception section 2 (FIG. 4D). As described above, production steps of the conventional method are used so as to form the light shielding film 4. Thereafter, the silicon oxide film 10 having a thickness of about 20000 Å to 25000 Å is deposited by using a CVD technique and a thickness of about 10000 Å is removed from the resultant film by a chemical machine polishing (FIG. 4E). Thereafter, a P-SiN film 5 having a thickness of about 3000 Å to 10000 Å is deposited on the silicon oxide film 10, thereby flattening a top surface of the P-SiN film 5 (FIG. 4F).

Figure 4G:
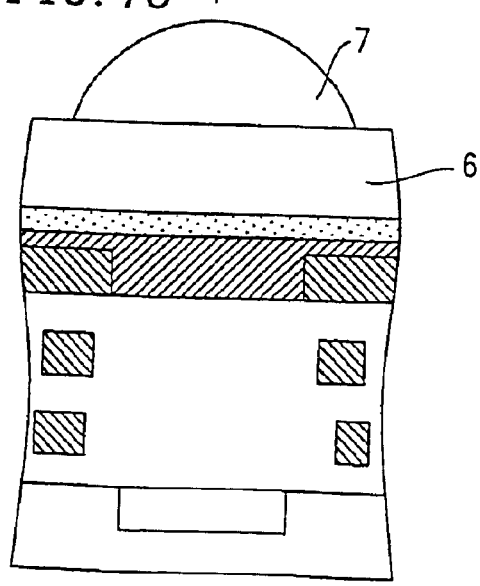

In another way of flattening, conventional production steps are used so as to form the light shielding film 4, and thereafter, SOG is applied to the light shielding film 4 as the silicon oxide film 10 (FIG. 4E). A P-SiN film 5 is deposited on the flattened silicon oxide film 10, which is formed of an SOG film, so as to obtain the P-SiN film 5 having a flat top surface (FIG. 4F). In this case, the applied SOG film has a thickness of about 10000 Å to 15000 Å, and the P-SiN film 5 having a thickness of about 3000 Å to 10000 Å is deposited by a CVD technique. Thereafter, the planarization film 6 is formed by applying an acrylic material to the P-SiN film 5. In the case of a color solid-state imaging device, an acrylic material is applied; a color filter is formed; and then the acrylic material is further applied thereto as a protection coating, thereby completing the planarization film 6. Thereafter, a lens material is applied thereto and the microlens 7 is formed by patterning and heat treatment (FIG. 4G).

As described above, according to the present invention, the stepped portion can be eliminated by flattening a top surface of the passivation film, so that incident light can be converged on the light reception section. Therefore, the present invention makes it possible to provide a solid-state imaging device which is capable of efficiently converging incident light on a light reception section thereof so as to be adapted for reduced pixel size.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A solid-state imaging device, comprising:
    a semiconductor substrate;
    a light shielding section having an aperture for partially shielding light incident on a surface of the semiconductor substrate;
    a light reception section for converting the light which is incident on the surface of the semiconductor substrate through the aperture to an electric charge;
    a single, continuous thin film used as a passivation section having a substantially flat top surface and a refractive index and overlying the light shielding section, the light reception section and the aperture; and
    a planarization section overlying the substantially flat top surface of said thin film used as a passivation section, wherein the planarization section has a refractive index smaller than the refractive index of the thin film used as a passivation section.

2. A solid-state imaging device according to claim 1, wherein the thin film used as a passivation section comprises at least a silicon nitride-based monolayer film.

3. A solid-state imaging device according to claim 1, further comprising an insulation section having a substantially flat top surface which is interposed between the thin film used as a passivation section and the light shielding section.

4. A solid-state imaging device according to claim 3, wherein the insulation section comprises at least a silicon oxide-based monolayer film.

5. A solid-state imaging device according to claim 4, wherein the insulation section comprises at least a SOG film.

6. A solid-state imaging device according to claim 1, wherein the thin film used as a passivation section comprises at least a SOG film.

7. A method for producing a solid-state imaging device, wherein the device comprises:
    a semiconductor substrate;
    a light shielding section having an aperture for partially shielding light incident on a surface of the semiconductor substrate;
    a light reception section for converting the light which is incident on the surface of the semiconductor substrate through the aperture to an electric charge;
    a single, continuous passivation section having a substantially flat top surface and overlying the light shielding section, the light reception section and the aperture; and
    a planarization section overlying the substantially flat top surface of said passivation section, wherein the planarization section has a refractive index smaller than the refractive index of the passivation section, wherein the method comprises the steps of:
    forming a single, continuous thin film used for forming the passivation, section on the light shielding section and the aperture;
    flattening a surface of the single, continuous thin film to form the passivation section by chemical machine polishing; and
    forming a thin film used for forming the planarization section atop the substantially flat top surface of the passivation section; and
    flattening a surface of the thin film used for forming the passivation section by chemical machine polishing.

8. A method according to claim 7, wherein the method further comprises the step of forming a SOG film to the thin film used as a passivation section.

9. A method for producing a solid-state imaging device, wherein the device comprises:
a semiconductor substrate;
a light shielding section having an aperture for partially shielding light incident on a surface of the semiconductor substrate;
a light reception section for converting the light which is incident on the surface of the semiconductor substrate through the aperture to an electric charge; and
a passivation section having a substantially flat top surface and overlying the light shielding section, the light reception section and the aperture so as to provide moisture and chemical resistance and to provide barrier properties against impurities, wherein the method comprises the steps of:
forming a thin film used for forming the passivation section on the light shielding section;
applying an SOG film to the thin film used for forming the passivation section; and
flattening a surface of the thin film to form the passivation section by performing an etchback technique under a condition that a selective ratio of the SOG film to the thin film used for forming the passivation section is about 1:1.

10. A method for producing a solid-state imaging device, wherein the device comprises:
a semiconductor substrate;
a light shielding section having an aperture for partially shielding light incident on a surface of the semiconductor substrate;
a light reception section for converting the light which is incident on the surface of the semiconductor substrate through the aperture to an electric charge;
a single, continuous thin film used as a passivation section having a substantially flat top surface and a reflective index and overlying the light shielding section, the light reception section and the aperture so as to provide moisture and chemical resistance and to provide barrier properties against impurities, and an insulation section having a substantially flat top surface which is interposed between the thin film used as a passivation section and the light shielding section; and
a planarization section overlying the substantially flat top surface of said thin film used as a passivation section, wherein the planarization section has a refractive index smaller than the refractive index of the thin film used as a passivation section, wherein the method comprises the steps of:
forming the insulation section on the light shielding section;
flattening a surface of the insulation section by chemical machine polishing;
forming the thin film used as a passivation section so as to have the substantially flat top surface by depositing a material used for forming the passivation section on the insulation section; and
forming the planarization section by depositing a material used for forming the planarization section on the substantially flat top surface of the thin film used as a passivation section.

11. A method according to claim 10, wherein the method further comprises the step of forming a SOG film to the thin film used as a passivation section.

12. A method for producing a solid-state imaging device, wherein the device comprises:
a semiconductor substrate;
a light shielding section having an aperture for partially shielding light incident on a surface of the semiconductor substrate;
a light reception section for converting the light which is incident on the surface of the semiconductor substrate through the aperture to an electric charge;
a single, continuous thin film used as a passivation section having a substantially flat top surface and a reflective index and overlying the light shielding section, a light reception section and the aperture;
a planarization section overlying the substantially flat top surface of said thin film used as a passivation section, wherein the planarization section has a refractive index smaller than the refractive index of the thin film used as a passivation section; and
an insulation section having a substantially flat top surface which is interposed between the thin film used as a passivation section and the light shielding section so as to provide moisture and chemical resistance and to provide barrier properties against impurities, wherein the method comprises the steps of:
forming the insulation section so as to have the substantially flat top surface by applying an SOG film to the light shielding section and the aperture; and
forming the single, continuous thin film used as a passivation section so as to have the substantially flat top surface by depositing a material used for forming the single, continuous thin film used as a passivation section on the insulation section; and
forming the planarization section by depositing a material used for forming the planarization section on the substantially flat top surface of the thin film used as a passivation section.

13. A solid-state imaging device, comprising:
a semiconductor substrate;
a light shielding section having an aperture for partially shielding light incident on a surface of the semiconductor substrate;
a light reception section for converting the light which is incident on the surface of the semiconductor substrate through the aperture to an electric charge; and
a single, continuous thin film used as a passivation section having a substantially flat top surface and overlying the light shielding section, the light reception section and the aperture so as to provide moisture and chemical resistance and to provide barrier properties against impurities and others.

14. A method for producing a solid-state imaging device, wherein the device comprises:
a semiconductor substrate;
a light shielding section having an aperture for partially shielding light incident on a surface of the semiconductor;
a light reception section for converting the light which is incident on the surface of the semiconductor substrate through the aperture to an electric charge; and
a single, continuous passivation section having a substantially flat top surface and overlying the light shielding section, the light reception section and the aperture so as to provide moisture and chemical resistance and to provide barrier properties against impurities and others, wherein the method comprises the steps of:

forming a single, continuous thin film used for forming the passivation section on the light shielding section and the aperture; and flattening a surface of the single, continuous thin film to form the passivation section by chemical machine polishing.

15. A solid-state imaging device, comprising:

a semiconductor substrate;

a light shielding section having an aperture for partially shielding light incident on a surface of the semiconductor substrate;

a light reception section for converting the light which is incident on the surface of the semiconductor substrate through the aperture to an electric charge;

a passivation section having a substantially flat top surface and a refractive index and overlying the light shielding section, the light reception section and the aperture; and a planarization section overlying the substantially flat top surface of said passivation section, wherein the planarization section has a refractive index smaller than the refractive index of the passivation section, wherein a selection ratio of the planarization section to the passivation section is about 1:1.

16. A solid-state imaging device according to claim 15, wherein the passivation section comprises at least a silicon nitride-based monolayer film.

17. A solid-state imaging device according to claim 15, further comprising an insulation section having a substantially flat top surface which is interposed between the passivation section and the light shielding section.

18. A solid-state imaging device according to claim 17, wherein the insulation section comprises at least a silicon oxide-based monolayer film.

19. A solid-state imaging device according to claim 18, wherein the insulation section comprises at least a SOG film.

20. A solid-state imaging device according to claim 15, wherein the passivation section comprises at least a SOG film.

* * * * *